United States Patent
Lin et al.

(10) Patent No.: US 11,456,100 B2
(45) Date of Patent: Sep. 27, 2022

(54) MRAM STACKS, MRAM DEVICES AND METHODS OF FORMING THE SAME

(71) Applicant: Taiwan Semiconductor Manufacturing Co., Ltd., Hsinchu (TW)

(72) Inventors: Shy-Jay Lin, Hsinchu County (TW); Wilman Tsai, Saratoga, CA (US); Ming-Yuan Song, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 109 days.

(21) Appl. No.: 16/805,863

(22) Filed: Mar. 2, 2020

(65) Prior Publication Data

US 2020/0365308 A1    Nov. 19, 2020

Related U.S. Application Data

(60) Provisional application No. 62/849,163, filed on May 17, 2019.

(51) Int. Cl.

| | |
|---|---|
| *H01L 43/10* | (2006.01) |
| *H01F 10/32* | (2006.01) |
| *G11C 11/16* | (2006.01) |
| *H01L 43/02* | (2006.01) |
| *H01L 43/12* | (2006.01) |
| *H01F 41/32* | (2006.01) |
| *H01L 27/22* | (2006.01) |

(52) U.S. Cl.
CPC .......... *H01F 10/329* (2013.01); *G11C 11/161* (2013.01); *H01F 10/3259* (2013.01); *H01F 10/3286* (2013.01); *H01F 41/32* (2013.01); *H01L 27/228* (2013.01); *H01L 43/02* (2013.01); *H01L 43/10* (2013.01); *H01L 43/12* (2013.01)

(58) Field of Classification Search
CPC ............... H01F 10/329; H01F 10/3259; H01F 10/3286; H01F 41/32; G11C 11/161; H01L 27/228; H01L 43/02; H01L 43/10; H01L 43/12
USPC ........................................................ 257/421
See application file for complete search history.

(56) References Cited

U.S. PATENT DOCUMENTS

| | | | | |
|---|---|---|---|---|
| 9,608,039 | B1* | 3/2017 | Apalkov | G11C 11/161 |
| 10,127,956 | B2* | 11/2018 | Lee | G11C 11/02 |
| 10,302,711 | B2* | 5/2019 | Wang | G01R 33/077 |
| 10,964,468 | B2* | 3/2021 | Salahuddin | H01L 43/02 |
| 2015/0311901 | A1* | 10/2015 | Bromberg | G11C 11/161 |
| | | | | 326/38 |
| 2018/0151210 | A1* | 5/2018 | Li | H01L 43/08 |
| 2019/0103552 | A1* | 4/2019 | Shiokawa | H01L 43/12 |
| 2019/0131519 | A1* | 5/2019 | Ikegawa | H01F 10/3254 |
| 2019/0228894 | A1* | 7/2019 | Hara | H01F 10/3268 |
| 2019/0295617 | A1* | 9/2019 | Wang | G11C 11/1675 |
| 2019/0304523 | A1* | 10/2019 | O'Brien | G11C 11/161 |

(Continued)

*Primary Examiner* — Jami Valentine Miller
(74) *Attorney, Agent, or Firm* — JCIPRNET

(57) ABSTRACT

Memory stacks, memory devices and method of forming the same are provided. A memory stack includes a spin-orbit torque layer, a magnetic bias layer and a free layer. The magnetic bias layer is in physical contact with the spin-orbit torque layer and has a first magnetic anisotropy. The free layer is disposed adjacent to the spin-orbit torque layer and has a second magnetic anisotropy perpendicular to the first magnetic anisotropy.

20 Claims, 8 Drawing Sheets

(56) References Cited

U.S. PATENT DOCUMENTS

| | | | |
|---|---|---|---|
| 2019/0304524 A1* | 10/2019 | Oguz | H01L 43/02 |
| 2019/0304653 A1* | 10/2019 | Oguz | H01F 10/3254 |
| 2019/0326353 A1* | 10/2019 | O'Brien | H01F 10/3254 |
| 2019/0386205 A1* | 12/2019 | Gosavi | H01L 43/04 |
| 2020/0006424 A1* | 1/2020 | Sato | G11C 11/1673 |
| 2020/0006630 A1* | 1/2020 | Sato | G11C 11/1675 |
| 2020/0006631 A1* | 1/2020 | Sato | H01L 27/228 |
| 2020/0105998 A1* | 4/2020 | Smith | G11C 11/1675 |
| 2020/0227104 A1* | 7/2020 | Rahman | G11C 11/18 |
| 2020/0227105 A1* | 7/2020 | Gosavi | H01L 43/08 |
| 2020/0227474 A1* | 7/2020 | O'Brien | H01L 43/14 |
| 2020/0343301 A1* | 10/2020 | Buford | H01L 43/12 |

* cited by examiner

MRAM STACKS, MRAM DEVICES AND METHODS OF FORMING THE SAME

CROSS-REFERENCE TO RELATED APPLICATION

This application claims the priority benefit of U.S. provisional application Ser. No. 62/849,163, filed on May 17, 2019. The entirety of the above-mentioned patent application is hereby incorporated by reference herein and made a part of this specification.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell. Various techniques directed at configurations and materials of MRAMs have been implemented to try and further improve device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
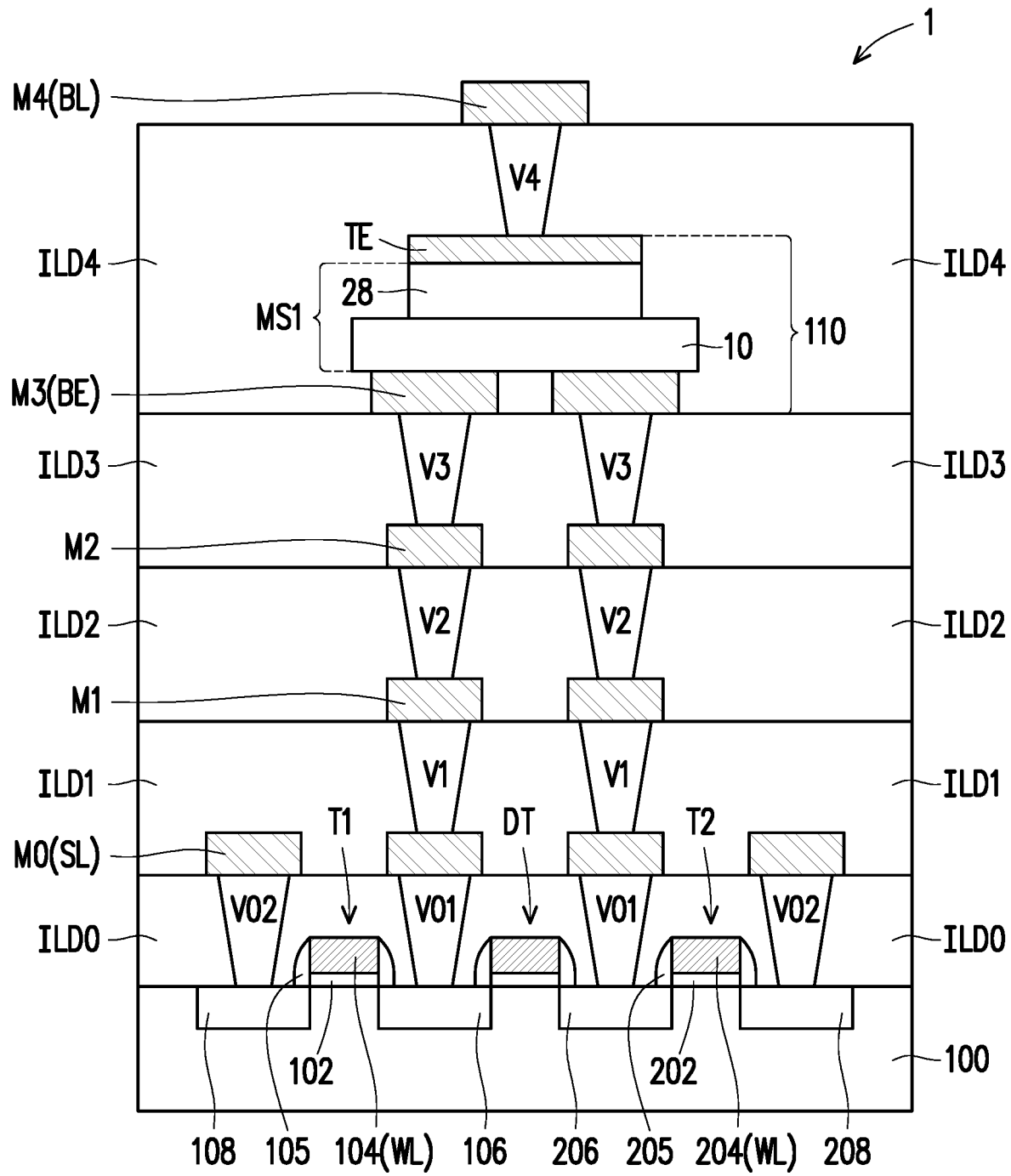
FIG. 1 is a schematic cross-sectional view of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
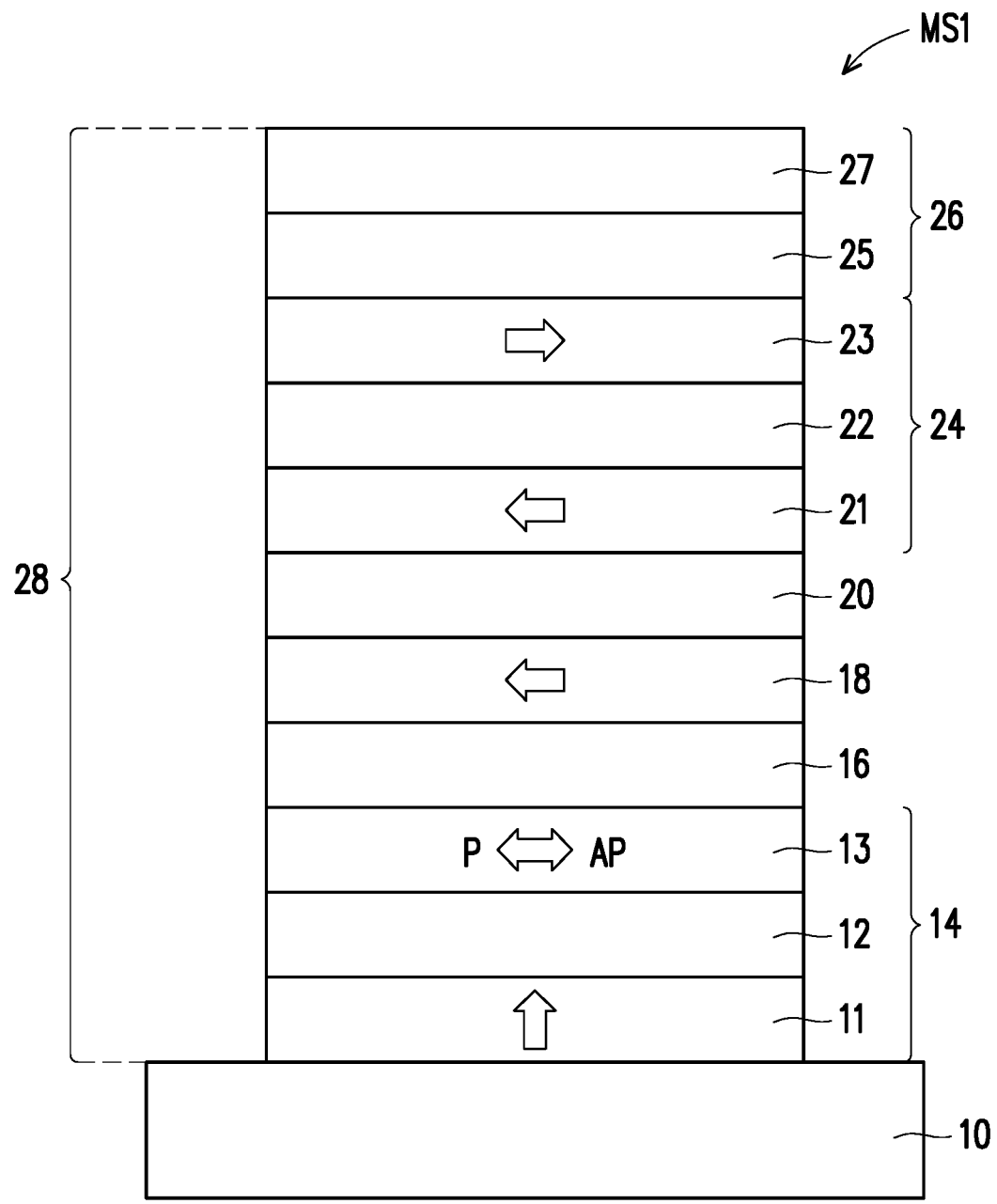
FIG. 2 is a schematic cross-sectional view of a memory stack in accordance with some embodiments.

FIG. 1 is a schematic cross-sectional view of a memory device in accordance with some embodiments. FIG. 2 is a schematic cross-sectional view of a memory stack in accordance with some embodiments.

Referring to FIG. 1 and FIG. 2, a memory device 1 includes a substrate 100, a first transistor T1, a second transistor T2 and a MRAM cell 110.

In some embodiments, the substrate 100 includes silicon and/or elementary semiconductor such as germanium. Alternatively or additionally, the substrate may include a compound semiconductor such as silicon carbide, gallium arsenide, indium arsenide, and/or indium phosphide. In some embodiments, the substrate 100 may include a silicon-on-insulator (SOI) structure. The substrate 100 may also include various doping configurations depending on design requirements as is known in the art such as P-type substrate and/or N-type substrate and various doped regions such as P-wells and/or N-wells.

In some embodiments, the first transistor T1 and the second transistor T2 are disposed separately on the substrate 100. Each of the first transistor T1 and the second transistor T2 may be a lateral transistor, a vertical transistor or a suitable semiconductor device, like a bipolar device. The transistor is a FinFET device, a tunnel FET ("TFET") device, a gate-all-around ("GAA") device or a suitable device depending on MRAM circuitry design.

In some embodiments, the first transistor T1 includes a gate dielectric layer 102, a gate electrode 104 over the gate dielectric layer 102 and a spacer 105 aside the gate electrode 104. Similarly, the second transistor T2 includes a gate dielectric layer 202, a gate electrode 204 over the gate dielectric layer 202 and a spacer 205 aside the gate electrode 204.

Each of the gate dielectric layers 102 and 202 may include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, the like, or a combination thereof. In alternative embodiments, each of the gate dielectric layers 102 and 202 can optionally include a silicate such as HfSiO, LaSiO, AlSiO, the like, or a combination thereof.

Each of the gate electrodes 104 and 204 may include a metal material suitable for forming a metal gate or portion thereof. In some embodiments, each of the gate electrodes 104 and 204 includes a work function metal layer and a fill metal layer on the work function metal layer. The work function metal layer is an N-type work function metal layer and/or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or a suitable material. In some embodiments, each of the gate electrodes 104 and 204 functions as a word line WL.

Each of the spacers 105 and 205 may include a nitrogen-containing dielectric material, a carbon-containing dielectric material or both, and the spacers 104 have a dielectric constant less than about 10, or even less than about 5. In some embodiments, the spacers 104 include SiN, SiCN, SiOCN, SiOR (wherein R is an alkyl group such as $CH_3$, $C_2H_5$ or $C_3H_7$), SiC, SiOC, SiON, the like, or a combination thereof.

In some embodiments, the first transistor T1 has two source/drain regions 106 and 108 in the substrate 100 at two sides thereof. In some embodiments, the source/drain region 106 functions as a drain region, and the source/drain region 108 functions as a source region. Similarly, the first transistor T2 has two source/drain regions 206 and 208 in the substrate 100 at two sides thereof. In some embodiments, the source/drain region 206 functions as a drain region, and the source/drain region 208 functions as a source region. In some embodiments, the source/drain region 106 of the first transistor T1 is disposed adjacent to the source/drain region 206 of the first transistor T2.

In some embodiments, each of the source/drain regions 106, 108, 206 and 208 includes silicon germanium (SiGe) for a P-type device. In alternative embodiments, each of the source/drain regions 106, 108, 206 and 208 includes silicon carbon (SiC), silicon phosphate (SiP), SiCP or a SiC/SiP multi-layer structure for an N-type device. In some embodiments, the source/drain regions 106, 108, 206 and 208 may be optionally implanted with a P-type dopant or an N-type dopant as needed.

In some embodiments, a dummy transistor DT is further included and disposed between the first transistor T1 and the second transistor T2. The dummy transistor DT includes a dummy gate dielectric layer, a dummy gate electrode over the dummy gate dielectric layer and a dummy spacer aside the dummy gate electrode. The dummy transistor DT is formed during the formation of the first transistor T1 and the second transistor T2. In some embodiments, the dummy transistor DT is grounded during the operation of the memory device 1.

In some embodiments, a zeroth interlayer dielectric layer ILD0 is formed over the first and second transistors T1 and T2, and a zeroth metal layer M0 is formed on the zeroth interlayer dielectric layer ILD0. In some embodiments, the zeroth metal layer M0 functions as a source line SL. In some embodiments, the zeroth metal layer M0 is electrically coupled to the source/drain region 106 and 108 through zeroth via plugs V01 and V02, respectively. Similarly, the zeroth metal layer M0 is electrically coupled to the source/drain regions 206 and 208 through zeroth via plugs V01 and V02, respectively.

In some embodiments, the zeroth interlayer dielectric layer ILD0 includes nitride such as silicon nitride, oxide such as silicon oxide, phosphosilicate glass (PSG), borosilicate glass (BSG), boron-doped phosphosilicate glass (BPSG), the like, or a combination thereof, and is formed by a suitable deposition technique such as spin-coating, chemical vapor deposition (CVD), flowable CVD, plasma-enhanced CVD (PECVD), atomic layer deposition (ALD), the like, or a combination thereof. In some embodiments, an etch stop layer is formed included in the zeroth interlayer dielectric layer ILD0, and the etch stop layer includes SiN, SiC or the like.

In some embodiments, each of the zeroth meta layer M0 and the zeroth via plugs V01/V02 includes Al, Cu, AlCu, Au, Ti, TiN, Ta, TaN, W, WN or a combination thereof, and is formed by a suitable technique such as sputtering, electroless plating, electro plating, PVD, CVD, ALD, the like, or a combination thereof.

In some embodiments, a first interlayer dielectric layer ILD1 is formed over the zeroth interlayer dielectric layer ILD0, and a first metal layer M1 is formed on the first interlayer dielectric layer ILD1. In some embodiments, the first metal layer M1 is electrically coupled to the zeroth metal layer M0 (and therefore the source/drain region 106) through a first via plug V1. Similarly, the first metal layer M1 is electrically coupled to the zeroth metal layer M0 (and therefore the source/drain region 206) through another first via plug V1. The materials and forming methods of the first interlayer dielectric layer ILD1, the first metal layer M1 and the first via plugs V1 are similar to those of the zeroth interlayer dielectric layer ILD0, the zeroth metal layer M0 and the zeroth via plugs V01/V02 described above, so the details are not iterated herein.

In some embodiments, a second interlayer dielectric layer ILD2 is formed over the first interlayer dielectric layer ILD1, and a second metal layer M2 is formed on the second interlayer dielectric layer ILD2. In some embodiments, the second metal layer M2 is electrically coupled to the first metal layer M1 (and therefore the source/drain region 106) through a second via plug V2. Similarly, the second metal layer M2 is electrically coupled to the first metal layer M1 and therefore the source/drain region 206 through another second via plug V2. The materials and forming methods of the second interlayer dielectric layer ILD2, the second metal layer M2 and the second via plugs V2 are similar to those of the zeroth interlayer dielectric layer ILD0, the zeroth metal layer M0 and the zeroth via plugs V01/V02 described above, so the details are not iterated herein.

In some embodiments, a third interlayer dielectric layer ILD3 is formed over the second interlayer dielectric layer ILD2, and a third metal layer M3 is formed on the third interlayer dielectric layer ILD3. In some embodiments, two patterns of the third metal layer M3 function as bottom electrodes BE of the MRAM cell 110. In some embodiments, the third metal layer M3 is electrically coupled to the second metal layer M2 (and therefore the source/drain region 106) through a third via plug V3. Similarly, the third metal layer M3 is electrically coupled to the second metal layer M2 (and therefore the source/drain region 206) through another third via plug V3. The materials and forming methods of the third interlayer dielectric layer ILD3, the third metal layer M3 and the third via plugs V3 are similar to those of the zeroth interlayer dielectric layer ILD0, the zeroth metal layer M0 and the zeroth via plugs V01/V02 described above, so the details are not iterated herein.

Referring to FIG. 1 and FIG. 2 simultaneously, a memory stack MS1 such as a MRAM stack is formed on the bottom electrodes BE of the third metal layer M3. Specifically, in addition to the bottom electrodes BE, the MRAM cell 110 further includes a spin-orbit torque (SOT) layer 10 and an overlying magnetic tunnel junction (MTJ) stack 28. In some embodiments, the width of the MTJ stack 28 is less than the width of the SOT layer 10. In some embodiments, the MTJ stack 28 includes, from bottom to top, a synthetic free layer 14, a tunneling barrier layer 16 and a reference layer 18.

In some embodiments, the MTJ stack 28 includes a dielectric layer (e.g., tunneling barrier layer 16) sandwiched between a magnetic fixed layer (e.g., reference layer 18) and a magnetic free layer (e.g., synthetic free layer 14) whose magnetization polarity can be changed. Due to the tunnel magnetoresistance effect, the resistance value between the reference layer and the synthetic free layer changes with the magnetization polarity switch in the synthetic free layer. Parallel magnetizations ("P state") lead to a lower electric resistance, whereas antiparallel magnetizations ("AP state") lead to a higher electric resistance. The two states of the resistance values are considered as two logic states "1" or "0" that are stored in the MRAM cell.

In some embodiments, the memory stack MS1 is a spin-orbit torque ("SOT") MRAM ("SOT-MRAM") stack. In the SOT-MRAM stack, a MTJ structure is positioned on a heavy metal layer with large spin-orbit interaction. The free layer (e.g., synthetic free layer 14) is in direct contact with the heavy metal layer (e.g., SOT layer 10). Spin torque is induced by the in-plane current injected through the heavy metal layer under the spin-orbit coupling effect, which generally includes one or more of the Rashba effect or the spin Hall effect ("SHE effect"). The write current does not pass through the vertical MTJ. Instead, the write current passes through the heavy metal layer in an in-plane direction. The magnetization polarity in the free layer (e.g., synthetic free layer 14) is set through the SOT effect. More specifically, when a current is injected in-plane in the heavy metal layer, the spin orbit coupling leads to an orthogonal spin current which creates a spin torque and induce magnetization reversal in the free layer.

In some embodiments, the SOT layer 10 is formed over the two bottom electrodes BE. Specifically, the two bottom electrodes BE are disposed below and in physical contact with two edge portions of the SOT layer 10, while exposes the central portion of the SOT layer 10. In some embodiments, the SOT layer 10 includes heavy metal such as W, Pt, AuPt or a combination thereof. In some embodiments, the SOT layer 10 has a thickness of about 1 nm to 5 nm. In some embodiments, the SOT layer 10 extends beyond the edges of the bottom electrodes BE. However, the disclosure is not limited thereto. In alternative embodiments, the edge of the SOT layer 10 is aligned with the edges of the bottom electrodes BE.

In some embodiments, the reference layer 18 is formed over the SOT layer 10. In some embodiments, the reference layer 18 has a fixed orientation or polarity, e.g., in the left direction as shown by a unidirectional arrow, parallel to a substrate plane or a plane which the MTJ stack 28 sits on. In some embodiments, the reference layer 18 includes one or more of Fe, Co, Ni, FeCo, CoNi, CoFeB, FeB, FePt, FePd and a suitable ferromagnetic material. In some embodiments, the reference layer 18 includes FeCo, CoFeB, FeB, the like, or a combination thereof. In some embodiments, the reference layer 18 includes CoFeB and has a thickness of about 1 nm to 3 nm.

In some embodiments, the synthetic free layer 14 is formed between the SOT layer 10 and the reference layer 18. Herein, the term "synthetic free layer" indicates a free layer including two layers configured to have magnetic anisotropies perpendicular to each other. Specifically, the synthetic free layer of the disclosure has a canting magnetic anisotropy. In some embodiments, the canting angle or tilting angle may be more than zero degrees and no more than about 45 degrees (i.e., 0<canting angle≤45). In some embodiments, such canting magnetic anisotropy improves the conversion rate of the synthetic free layer 14. The canting angle is naturally formed by adding an extra vertical layer in the stack. Such canting angle is helpful for the switching due to the symmetry breaking. For the perpendicular magnetic anisotropy (PMA) case, a perpendicular magnetization with an in-plane SOT current is known to require an external magnetic field along the current direction. A tilting angle can solve this issue because the special symmetry is broken due to the tilting angle. A larger angle can result in a lower switching current. The tilting angle should be small, usually would not exceed about 45 degrees. An larger tilting angle also indicates a smaller anisotropy/retention. This is the reason why switching current is lower.

In the present disclosure, the switching current of the device can be lower when the canting angle is greater than zero. However, the reading window of the device may be reduced when the canting angle is greater than 45 degrees. In the present disclosure, by controlling and adjusting the canting angle within the above range, both the switching current and the reading window can be improved, and the operation performance of the device is accordingly boosted.

In some embodiments, the synthetic free layer 14 includes a first free layer 11, a second free layer 13, and a non-magnetic metal spacer 12 between the first free layer 11 and the second free layer 13. In some embodiments, the first free layer 11 has a first magnetic anisotropy, and the second free layer 13 has a second magnetic anisotropy perpendicular to the first magnetic anisotropy. Specifically, the first free layer 11, the non-magnetic metal spacer 12 and the second free layer 13 together form a tri-layered synthetic free layer 14. The synthetic free layer 14 of the present disclosure functions as a tilting free layer because it provides special in-plane and perpendicular coupling. Such tilting free layer is a key since the perpendicular SOT-MRAM requires an external field and the present disclosure can solve this issue.

In some embodiments, the first free layer 11 is in physical contact with the SOT layer 10. The first free layer 11 is referred to as a magnetic bias layer in some examples. In some embodiments, the first free layer has a fixed orientation, polarity or magnetic anisotropy, e.g., in the up direction as shown by a unidirectional arrow, perpendicular to the substrate plane or the plane which the MTJ stack 28 sits on. In some embodiments, the first free layer 11 includes Co, CoNi, the like, or a combination thereof. Thin film magnetization generally lies in the plane of the film (in-plane magnetic anisotropy) in order to minimize the magnetostatic energy. However, a PMA axis is necessary for efficient spin torque switching. Multilayer systems such as Co/Ni, Co/Pd, and Co/Pt have strong PMA when they have sufficient face-centered cubic (FCC) (111) crystal orientation. In some embodiments, the first free layer 11 includes Co or a suitable ferromagnetic material, and is configured to form a perpendicular magnetic anisotropy (PMA) with Pt of the SOT layer 10. In some embodiments, the first free layer 11 has a thickness of about 0.5 nm to 1.5 nm.

The magnetization orientation of the second free layer 13 is switchable in the horizontal axis, as shown by a bi-directional arrow. The switchable magnetization orientation or magnetic anisotropy of the second free layer 13 represents two states thereof with respect to the magnetization orientation of the reference layer 18, a parallel state "P" or an antiparallel state "AP". In the "P" state, the magnetic anisotropy of the second free layer 13 is in the same direction as that of the reference layer 18, here in the left direction. In the "AP" state, the magnetic anisotropy of the second free layer 13 is in a different direction from that of the reference layer 18, here in the right direction.

In some embodiments, the second free layer 13 includes one or more of Fe, Co, Ni, FeCo, CoNi, CoFeB, FeB, FePt, FePd and a suitable ferromagnetic material. In some embodiments, the second free layer 13 includes CoFeB and has a thickness of about 1 nm to 3 nm.

In some embodiments, the thickness of the first free layer 11 is less than the thickness of the second free layer 13. However, the disclosure is not limited thereto. In alternative embodiments, the thickness of the first free layer 11 is substantially equal to or greater than the thickness of the second free layer 13.

In some embodiments, the non-magnetic metal spacer 12 between the first free layer 11 and the second free layer 13 includes one of more of PtCo, WCoFeB, Ru, RuFe, RuCo, Ir, IrFe, IrCo and a suitable ferromagnetic material. In some embodiments, the non-magnetic metal spacer 12 includes PtCo and/or WCoFeB and has a thickness of about 1 nm or less, such as about 0.1 nm to about 1 nm.

In some embodiments, the tunneling barrier layer 16 is disposed between the synthetic free layer 14 and the reference layer 18. The tunneling barrier layer 16 barriers the tunneling of charge carriers between the reference layer 18 and the synthetic free layer 14. In some embodiments, the tunneling barrier layer 16 includes an amorphous barrier, such as aluminum oxide ($AlO_x$) or titanium oxide ($TiO_x$), or a crystalline barrier, such as magnesium oxide (MgO) or a spinel (e.g., $MgAl_2O_4$). In some embodiments, the tunneling barrier layer 16 includes MgO and has a thickness of about 0.5 nm to 1.5 nm.

In some embodiments, the MTJ stack 28 further includes a synthetic anti-ferromagnetic (SAF) layer 24. The SAF layer 24 is configured to fix the orientation or magnetic anisotropy of the reference layer 18. In some embodiments, the SAF layer 24 is optional and is not a part of the MTJ stack 28.

In some embodiments, the SAF layer 24 includes one or more non-magnetic metal layers each sandwiched between two pinned ferromagnetic layers. For example, the SAF layer 24 may include two pinned ferromagnetic layers and one non-magnetic metal layer between the two pinned ferromagnetic layers. For example, the SAF layer 24 may include non-magnetic metal layers and pinned ferromagnetic layers stacked alternately. The non-magnetic metal layer is referred to as a coupling layer in some examples. The pinned ferromagnetic layer is referred to as a pinned layer or a ferromagnetic layer in some examples.

In some embodiments, the SAF layer 24 includes a first ferromagnetic layer 21, a second ferromagnetic layer 23 and a coupling layer 22 between the first ferromagnetic layer 21 and the second ferromagnetic layer 23. In some embodiments, the first ferromagnetic layer 21 has a third magnetic anisotropy, and the second ferromagnetic layer 23 has a fourth magnetic anisotropy antiparallel to the third magnetic anisotropy.

In some embodiments, the first ferromagnetic layer 21 has a fixed orientation or polarity, e.g., in the left direction as shown by a unidirectional arrow, parallel to the substrate plane or the plane which the MTJ stack 28 sits on. In some embodiments, the first ferromagnetic layer 21 includes one or more of Fe, Co, Ni, FeCo, CoNi, CoFeB, FeB, FePt, FePd and a suitable ferromagnetic material. In some embodiments, the first ferromagnetic layer 21 includes Co and/or CoFeB and has a thickness of about 1 nm to 3 nm.

In some embodiments, the second ferromagnetic layer 23 has a fixed orientation or polarity, e.g., in the right direction as shown by a unidirectional arrow, parallel to a substrate plane or a plane which the MTJ stack 28 sits on. In some embodiments, the second ferromagnetic layer 23 includes one or more of Fe, Co, Ni, FeCo, CoNi, CoFeB, FeB, FePt, FePd and a suitable ferromagnetic material. In some embodiments, the second ferromagnetic layer 23 includes Co and/or CoFeB and has a thickness of about 1 nm to 3 nm.

In some embodiments, the coupling layer 22 includes one or more of W, Mo, Ru, Ir and a suitable material. In some embodiments, the coupling layer 22 includes Ru and/or Ir and has a thickness of about 1 nm or less.

In some embodiments, the MTJ stack 28 further includes a spacer 20 between the reference layer 18 and the SAF layer 24. In some embodiments, the spacer 20 is optional and is not a part of the MTJ stack 28. In some embodiments, the spacer 20 includes one or more of W, Mo, Ru, Ir and a suitable material. In some embodiments, the spacer 20 includes W and/or Mo and has a thickness of about 1 nm or less.

In some embodiments, the material of the coupling layer 22 is different from that of the spacer 20. However, the disclosure is not limited thereto. In alternative embodiments, the material of the coupling layer 22 is the same as that of the spacer 20.

In some embodiments, the MTJ stack 28 further includes a capping structure 26 on the SAF layer 24. In some embodiments, the capping structure 26 is configured to serve as a hard mask for protecting the structure from being damaged in the subsequently processes. In some embodiments, the capping structure 26 is configured to prevent boron atoms from diffusing to the top electrode. In some embodiments, the capping structure 26 is optional and is not a part of the MTJ stack 28.

In some embodiments, the capping structure 26 includes a first capping layer 25 and an overlaying second capping layer 27. In some embodiments, the capping structure 26 includes one or more of Ta, Ru, TiN, TaN, W and a suitable material. In some embodiments, the first capping layer 25 includes Ru and has a thickness of about 1 nm to 3 nm. In some embodiments, the second capping layer 27 includes Ta and has a thickness of about 1 nm to 3 nm. The first capping layer 25 may serve as a hard mask, and the second capping layer 27 may serve as a diffusion barrier.

Continue referring to FIG. 1, a top electrode TE is formed on the MTJ stack 28. In some embodiments, the top electrode TE includes Al, Cu, AlCu, Au, Ti, TiN, Ta, TaN, W, WN or a combination thereof, and is formed by a suitable technique such as sputtering, electroless plating, electro plating, PVD, CVD, ALD, the like, or a combination thereof.

In some embodiments, the method of forming the SOI layer 10, the MTJ stack 28 and the top electrode TE includes forming multiple films over the bottom electrodes BE and patterning the films. Each of the multiple films is formed by a suitable technique such as sputtering, electroless plating, electro plating, PVD, CVD, ALD or the like, and the patterning operation includes photolithography etching processes.

Referring to FIG. 1 again, a fourth interlayer dielectric layer ILD4 is formed over the third interlayer dielectric layer ILD3, and a fourth metal layer M4 is formed on the fourth interlayer dielectric layer ILD4. In some embodiments, the fourth metal layer M4 functions as a bit line BL. In some embodiments, the fourth metal layer M4 is electrically coupled to the second metal layer M3 (and therefore the source/drain regions 106 and 206) through fourth via plugs V4. The materials and forming methods of the third interlayer dielectric layer ILD4, the fourth metal layer M4 and the fourth via plugs V4 are similar to those of the zeroth interlayer dielectric layer ILD0, the zeroth metal layer M0 and the zeroth via plugs V01/V02 described above, so the details are not iterated herein. The memory device 1 of the disclosure is thus completed. The memory device 1 of the disclosure is a two-transistor/one-resistor (2T1R) device.

The structures of the memory device and memory stack of the disclosure will be described below with reference to FIG. 1 and FIG. 2. In some embodiments, the memory device 1 includes a substrate 100, a first transistor T1, a second transistor T2 and a MARAM cell 110. The first transistor T1 is disposed over the substrate 100 and having a source/drain region (e.g., drain region) 106. The second transistor T2 is disposed over the substrate 100 and has a source/drain region (e.g., drain region) 206.

The MRAM cell 110 is disposed over the substrate 100. The MRAM cell 110 includes bottom electrodes BE, a SOT layer 10, a MTJ stack 28 and a top electrode TE. The MTJ stack 28 includes a synthetic free layer 14, a tunneling barrier layer 16 and a reference layer 18.

The bottom electrodes BE are respectively coupled to the source/drain region 106 of the first transistor T1 and the source/drain region 206 of the second transistor T2. The SOT layer 10 is disposed over the bottom electrodes BE. The synthetic free layer 14 is disposed over the SOT layer 10 and includes two layers configured to have magnetic anisotropies perpendicular to each other. In some embodiments, the synthetic free layer 14 includes a first free layer 11 with a perpendicular magnetic anisotropy and a second free layer 13 with a horizontal magnetic anisotropy. The first free layer 11 is in physical contact with the SOT layer 10. The synthetic free layer 14 further includes a non-magnetic metal spacer 12 between the first free layer 11 and the second free layer 13. The tunneling barrier layer 16 is disposed over the synthetic free layer 14. The reference layer 18 is disposed over the tunneling barrier layer 16. In some embodiments, the free layer 18 has a horizontal magnetic anisotropy.

In some embodiments, the tunneling barrier layer 16, the reference layer 18 and part of the synthetic free layer 14 (e.g., the second free layer 14) are all oriented in the same direction, such as the (100) direction.

In some embodiments, the memory stack MS1 further includes a capping structure 26 over the reference layer 18, and a SAF layer 24 between the capping structure 26 and the reference layer 18. In some embodiments, the SAF layer 24 includes a first ferromagnetic layer 21 and a second ferromagnetic layer 23, both of which have horizontal magnetic anisotropies antiparallel to each other.

In some embodiments, when the SAF layer 24 is oriented in the (111) direction different from the (100) direction of the reference layer 18, a spacer 20 is further included in the memory stack MS1. However, the disclosure is not limited thereto. In alternative embodiments, when the SAF layer 24 is oriented in the (100) direction the same as the (100) direction of the reference layer 18, the spacer 20 can be omitted from the memory stack MS1.

The tunneling barrier layer 16 is disposed over the synthetic free layer 14. The reference layer 18 is disposed over the tunneling barrier layer 16. The top electrode TE is disposed over the reference layer 18 and coupled to a bit line BL.

In some embodiments, the first free layer 11 of the synthetic free layer 14 that is in physical contact with the SOT layer 10 forms a perpendicular magnetic anisotropy with the SOT layer 10.

The above embodiment, the memory device 1 further includes a dummy transistor DT between first transistor T1 and the second transistor T2, and the dummy transistor DT is grounded.

The above embodiments in which the MRAM cell 110 are provided between the third metal layer M3 and the fourth metal layer M4 are provided for illustration purposes, and are not construed as limiting the present disclosure. In alternative embodiments, upon the process requirements, the MRAM cell 110 may be provided between two adjacent metal layers, such as between the first metal layer M1 and the second metal layer M2, between the second metal layer M2 and the third metal layer M3 or between the fourth metal layer M4 and the fifth metal layer M5.

Figure 3:
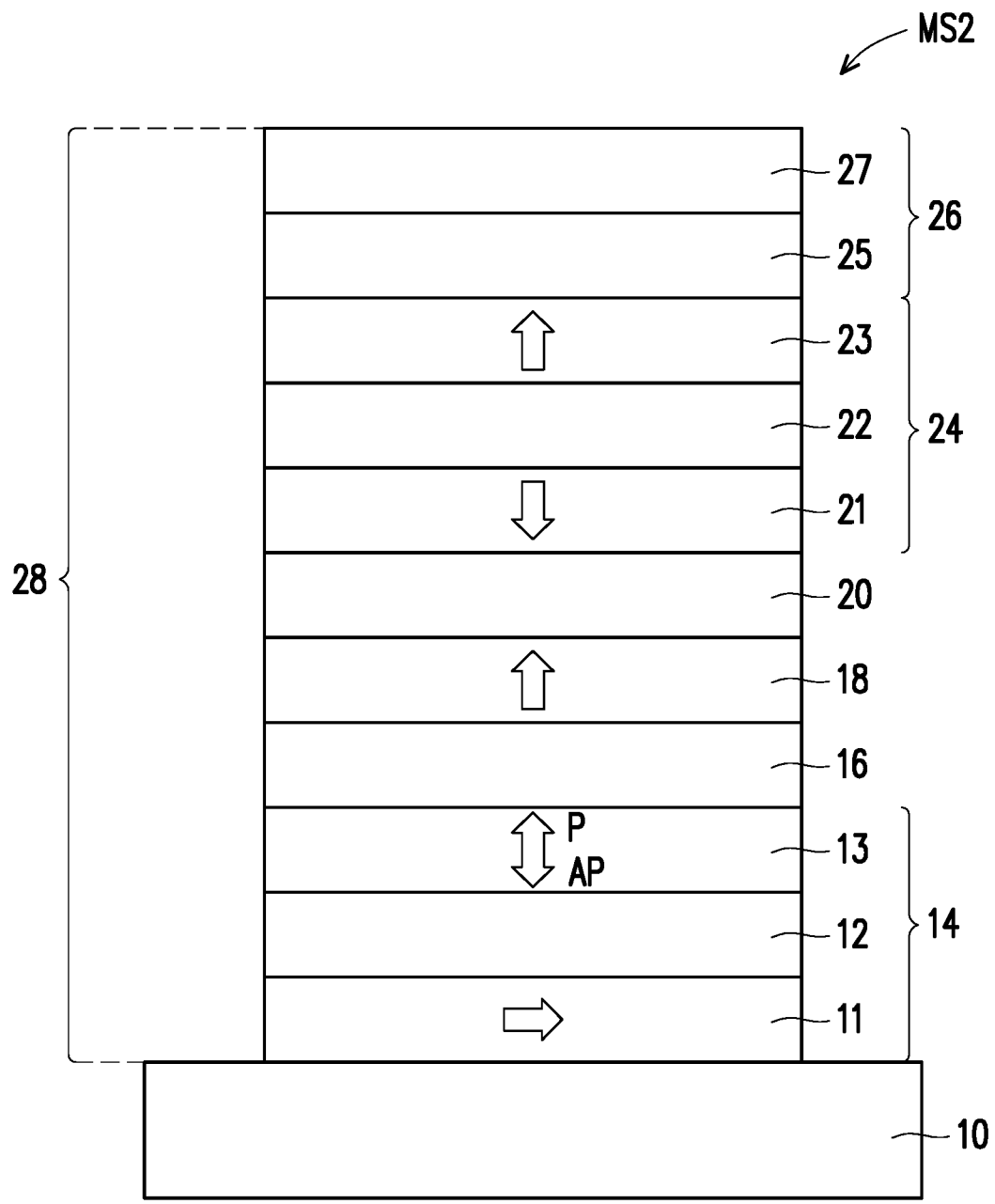
FIG. 3 is a schematic cross-sectional view of a memory stack in accordance with alternative embodiments.
Figure 4:
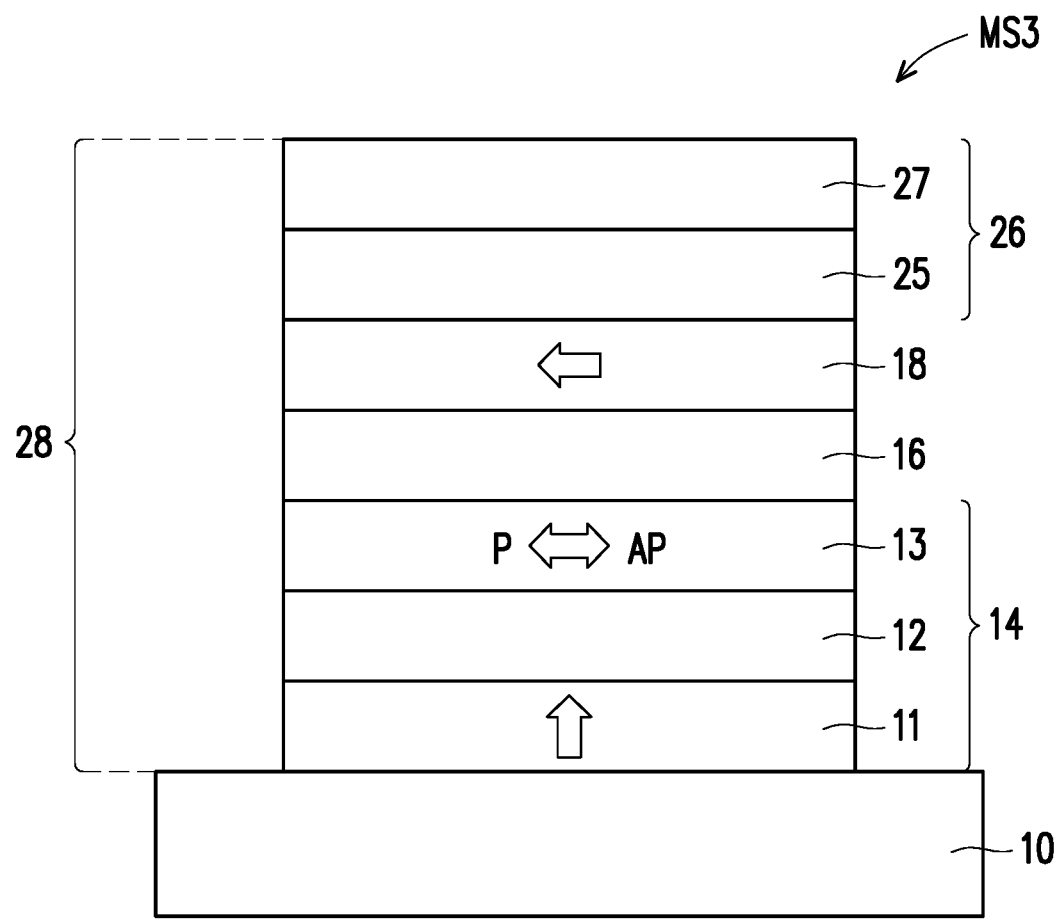
FIG. 4 is a schematic cross-sectional view of a memory stack in accordance with yet alternative embodiments.
Figure 5:
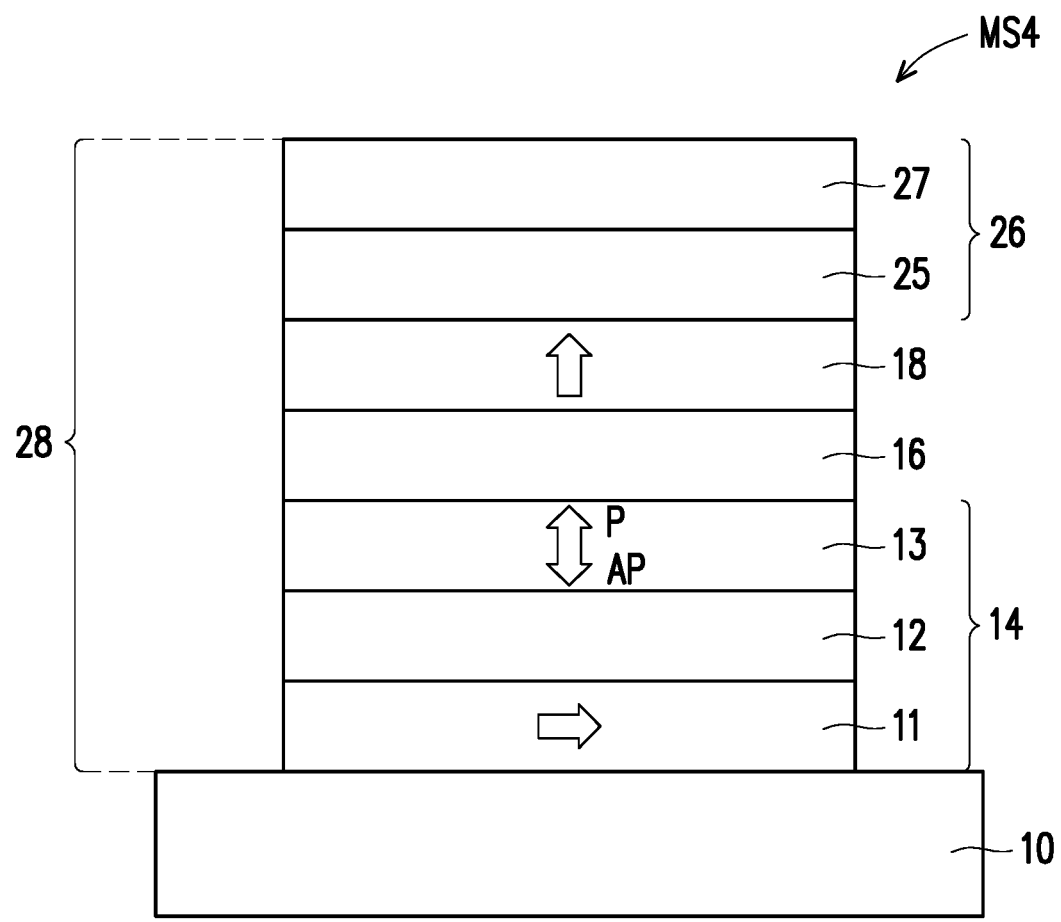
FIG. 5 is a schematic cross-sectional view of a memory stack in accordance with still alternative embodiments.

The memory stack MS1 in the memory device 1 may be modified to have other configurations, as shown in FIG. 3 to FIG. 5. Specifically, one of the memory stacks MS2 to MS4 in FIG. 3 to FIG. 5 may replace the memory stack MS1 in the memory device 1.

The memory stack MS2 of FIG. 3 is similar to the memory stack MS1 of FIG. 2, and the difference between them lies in that, the magnetic anisotropies of the synthetic free layer 14, the reference layer 18 and the SAF layer 24 are designed differently for memory stacks MS2 and MS1. Specifically, in the memory stack MS2 of FIG. 3, the synthetic free layer 14 includes a first free layer 11 with a horizontal magnetic anisotropy and a second free layer 13 with a perpendicular magnetic anisotropy. In some embodiments, the free layer 18 has a perpendicular magnetic anisotropy. In some embodiments, the SAF layer 24 includes a first ferromagnetic layer 21 and a second ferromagnetic layer 23, both of which have perpendicular magnetic anisotropies antiparallel to each other.

The memory stack MS3 of FIG. 4 is similar to the memory stack MS1 of FIG. 2, and the difference between them lies in that, the SAF layer 24 and the underlying spacer 20 are provided for the memory stack MS1 but are optionally omitted from the memory stack MS3. Specifically, in the memory stack MS3, the capping structure 26 is in physical contact with the reference layer 18.

The memory stack MS4 of FIG. 5 is similar to the memory stack MS2 of FIG. 3, and the difference between them lies in that, the SAF layer 24 and the underlying spacer 20 are provided for the memory stack MS2 but are optionally omitted from the memory stack MS4. Specifically, in the memory stack MS4, the capping structure 26 is in physical contact with the reference layer 18.

The major problem of the conventional SOT-MRAM resides in that an external magnetic field is required when writing the SOT memory cell thereof. As such, the process steps are complicated to provide the external magnetic field for the conventional SOT-MRAM. In the disclosure, the spin-torque from the magnetic bias layer (e.g., the first free layer 11) breaks the symmetry of the charge carriers flowing through the SOT layer, so an external field is not required to change the magnetic anisotropy of the synthetic free layer. In other words, the memory device 1 of the disclosure is an external field-free SOT-MRAM, so the process steps are simplified and the switching efficiency is improved.

In the above-mentioned embodiments, the magnetic bias layer (e.g., the first free layer 11) and the switchable free layer (e.g., the second free layer 13) are disposed at the same side of the SOT layer 10, as shown in FIG. 1 to FIG. 5. However, the disclosure is not limited thereto. In alternative embodiments, the magnetic bias layer (e.g., magnetic bias layer 31) and the switchable free layer (e.g., free layer 33) are disposed at opposite sides of the SOT layer 30, as shown in FIG. 6 to FIG. 8.

Figure 6:
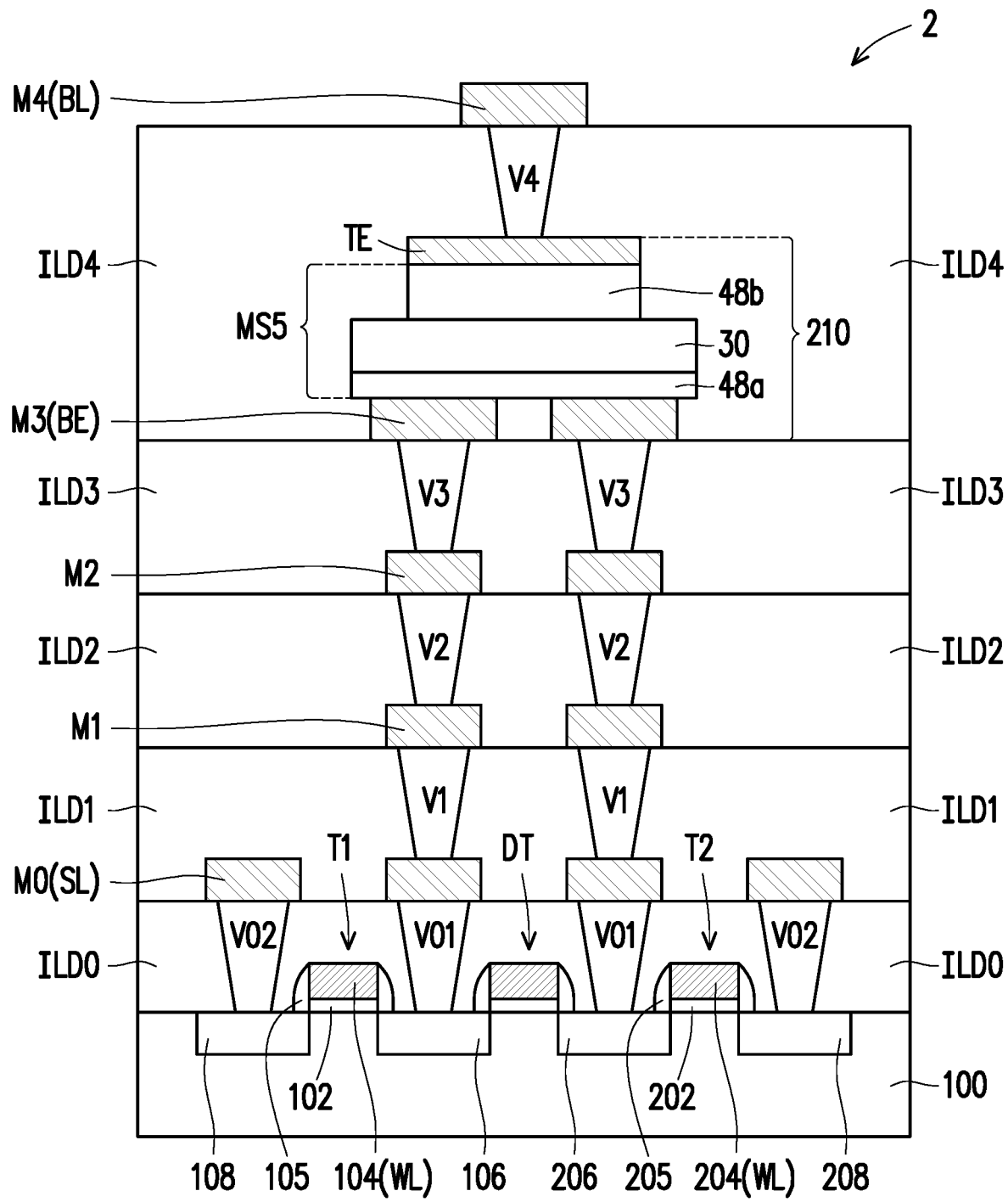
FIG. 6 is a schematic cross-sectional view of a memory device in accordance with alternative embodiments.

FIG. 6 is a schematic cross-sectional view of a memory device in accordance with alternative embodiments. FIG. 7 is a schematic cross-sectional view of a memory stack in accordance with some embodiments. FIG. 8 is a schematic cross-sectional view of a memory stack in accordance with alternative embodiments.

Figure 7:
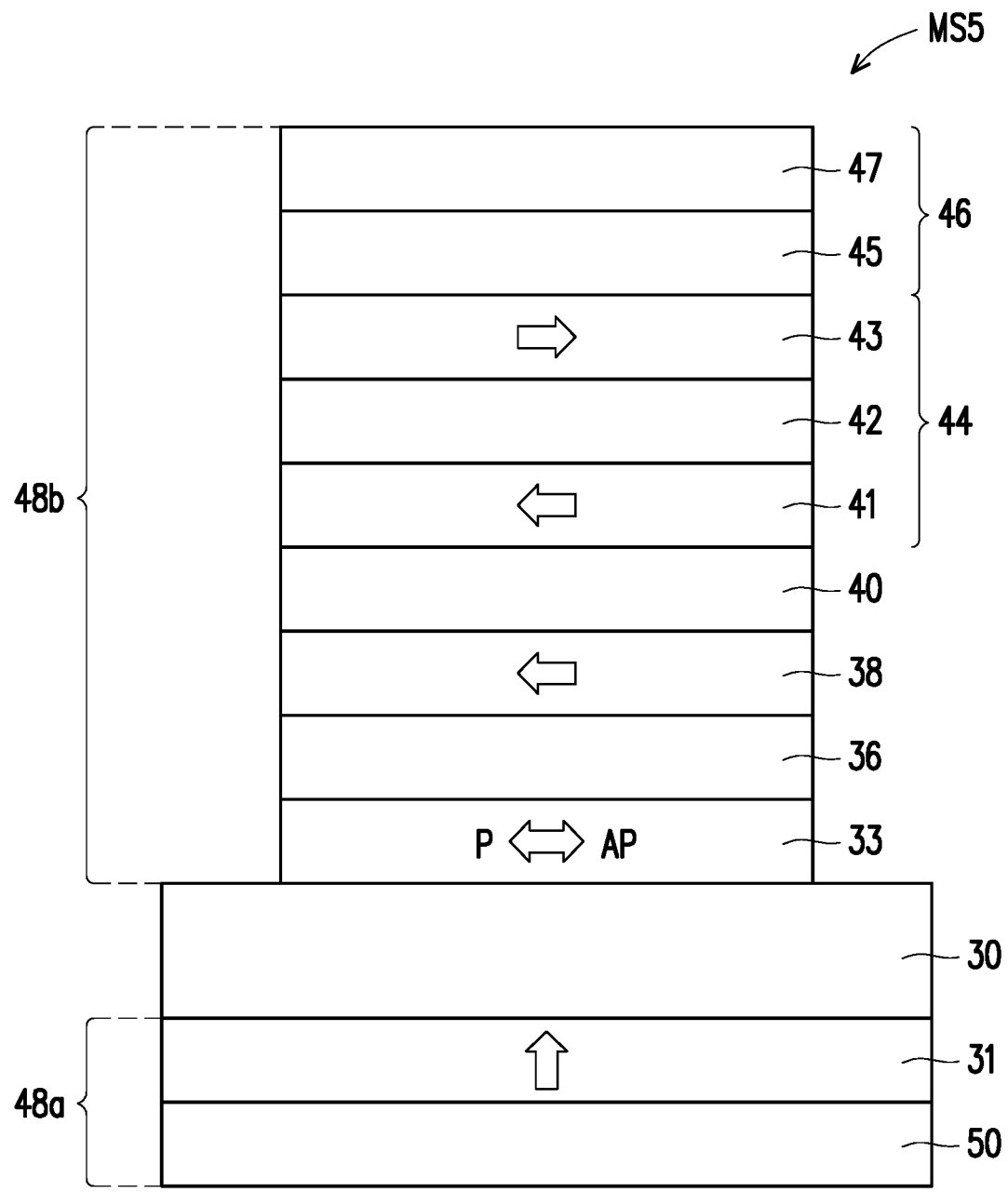
FIG. 7 is a schematic cross-sectional view of a memory stack in accordance with some embodiments.
Figure 8:
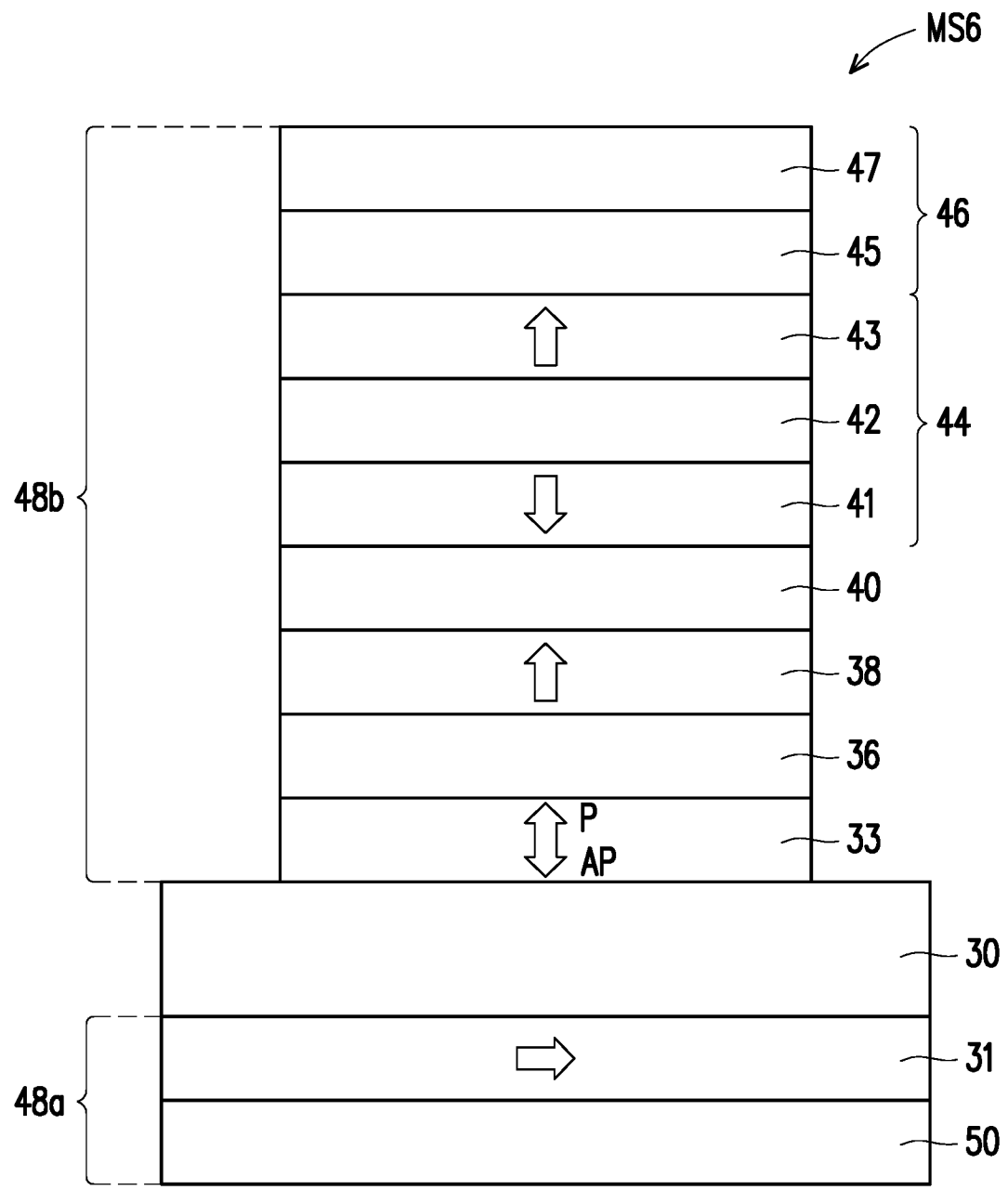
FIG. 8 is a schematic cross-sectional view of a memory stack in accordance with alternative embodiments.

Referring to FIG. 6 and FIG. 7, a memory device 2 includes a substrate 100, a first transistor T1, a second transistor T2 and a MRAM cell 210.

The memory device 2 of FIG. 6 is similar to the memory device 1 of FIG. 1, and the difference between them lies in that, the MRAM cell 210 of memory device 2 of FIG. 6 replaces the MRAM cell 110 of memory device 1 of FIG. 1.

The MRAM cell 210 of FIG. 6 is similar to the MRAM cell 110 of FIG. 1, and the difference between them lies in that, the memory stack MS5 of the MRAM cell 210 of FIG. 6 replaces the memory stack MS1 of the MRAM cell 110 of FIG. 1.

The memory stack MS5 of FIG. 6 is similar to the memory stack MS1 of FIG. 1, and the difference between them lies in that, the memory stack 48 of FIG. 6 are divided into two portions at opposite sides of the SOT layer 30, while the MTJ stack 28 of FIG. 1 is a bulk portion at the same side of the SOT layer 10.

Referring to FIG. 6 and FIG. 7 simultaneously, a memory stack MS5 such as a MRAM stack is formed on the bottom electrodes BE of the third metal layer M3. Specifically, in addition to the bottom electrodes BE, the MRAM cell 210 includes a SOT layer 10 and a MTJ stack 48. In some embodiments, the MTJ stack 48 includes a lower MTJ stack 48a disposed below the SOT layer 30 and an upper MTJ stack 48b disposed above the SOT layer 30. In some embodiments, the width of the lower MTJ stack 48a is substantially equal to the width of the SOT layer 30, while the width of the upper MTJ stack 48b is less than the width of the SOT layer 30.

In some embodiments, the lower MTJ stack 48a includes a magnetic bias layer 31. The magnetic bias layer 31 is in physical contact with the lower surface of the SOT layer 30. The material and function of the magnetic bias layer 31 are similar to those of the first free layer 11 described above, so the details are not iterated herein.

In some embodiments, the lower MTJ stack 48a further includes a buffer layer 50 between the magnetic bias layer 31 and the bottom electrodes BE. In some embodiments, the buffer layer 50 is configured to prevent boron atoms from diffusing to the bottom electrodes. In some embodiments, the buffer layer 50 includes one or more of Ta, Ru, TiN, TaN, W and a suitable material. In some embodiments, the buffer layer 50 includes Ta and has a thickness of about 1 nm to 3 nm. In some embodiments, the buffer layer 50 is optional and is not a part of the lower MTJ stack 48a. In such case, the magnetic bias layer 31 is in physical contact with the bottom electrodes BE.

In some embodiments, the upper MTJ stack 48b includes, from bottom to top, a free layer 33, a tunneling barrier layer 36 and a reference layer 38. The materials and functions of the free layer 33, the tunneling barrier layer 36 and the reference layer 38 are similar to those of the second free layer 13, the tunneling barrier layer 16 and the reference layer 18 described above, so the details are not iterated herein.

In some embodiments, the upper MTJ stack 48b optionally includes a SAF layer 44. In some embodiments, the SAF layer 44 includes a first ferromagnetic layer 41, a second ferromagnetic layer 43 and a coupling layer 42 between the first ferromagnetic layer 41 and the second ferromagnetic layer 43. The materials and functions of the first ferromagnetic layer 41, the coupling layer 42 and the second ferromagnetic layer 43 are similar to those of the first ferromagnetic layer 21, the coupling layer 22 and the second ferromagnetic layer 23 described above, so the details are not iterated herein.

In some embodiments, the upper MTJ stack 48b optionally includes a spacer 40 between the reference layer 38 and the SAF layer 44. The material and function of the spacer 40 are similar to those of the spacer 20 described above, so the details are not iterated herein. In some embodiments, when the SAF layer 44 is oriented in the (111) direction different from the (100) direction of the reference layer 38, the spacer 40 is further included in the memory stack MS5. In alternative embodiments, when the SAF layer 44 is oriented in the (100) direction the same as the (100) direction of the reference layer 38, the spacer 40 is omitted from the memory stack MS5.

In some embodiments, the upper MTJ stack 48b optionally includes a capping structure 46 over the reference layer 38. In some embodiments, the capping structure 46 includes a first capping layer 45 and an overlaying second capping layer 47. The materials and functions of the first capping layer 45 and the second capping layer 47 are similar to those of the first capping layer 25 and the second capping layer 27 described above, so the details are not iterated herein.

The memory stack MS6 of FIG. 8 is similar to the memory stack MS5 of FIG. 7, and the difference between them lies in that, the magnetic anisotropies of the magnetic bias layer 31, the free layer 33, the reference layer 38 and the SAF layer 44 are designed differently for memory stacks MS6 and MS5. Specifically, the magnetic bias layer 31 has a horizontal magnetic anisotropy, and the switchable free layer 33 has a perpendicular magnetic anisotropy. In some embodiments, the SAF layer 44 includes a first ferromagnetic layer 41 and a second ferromagnetic layer 43, both of which have perpendicular magnetic anisotropies antiparallel to each other.

In accordance with some embodiments of the present disclosure, a memory stack includes a spin-orbit torque layer, a magnetic bias layer and a free layer. The magnetic bias layer is in physical contact with the spin-orbit torque layer and has a first magnetic anisotropy. The free layer is disposed adjacent to the spin-orbit torque layer and has a second magnetic anisotropy perpendicular to the first magnetic anisotropy.

In accordance with alternative embodiments of the present disclosure, a memory stack includes a spin-orbit torque layer, a synthetic free layer, a tunneling barrier layer and a reference layer. The synthetic free layer is disposed over the spin-orbit torque layer, and includes a first free layer with a perpendicular magnetic anisotropy and a second free layer with a horizontal magnetic anisotropy. The tunneling barrier layer is disposed over the synthetic free layer. The reference layer is disposed over the tunneling barrier layer.

In accordance with yet alternative embodiments of the present disclosure, a memory device includes a substrate, a first transistor, a second transistor and a MRAM cell. The first transistor is disposed over the substrate and has a first source/drain region. The second transistor is disposed over the substrate and has a second source/drain region. The MRAM cell is disposed over the substrate, and includes first and second bottom electrodes, a spin-orbit torque layer, a synthetic free layer, a tunneling barrier layer, a reference layer and a top electrode. The first and second bottom electrodes are respectively coupled to the first source/drain region and the second source/drain region. The spin-orbit torque layer is disposed over the first and second bottom electrodes. The synthetic free layer is disposed over the spin-orbit torque layer and includes two layers configured to have magnetic anisotropies perpendicular to each other. The tunneling barrier layer is disposed over the synthetic free layer. The reference layer is disposed over the tunneling barrier layer. The top electrode is disposed over the reference layer and coupled to a bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory stack, comprising:
a spin-orbit torque layer;
a magnetic bias layer being in direct contact with the spin-orbit torque layer and having a first magnetic anisotropy; and
a free layer disposed adjacent to the spin-orbit torque layer and having a second magnetic anisotropy perpendicular to the first magnetic anisotropy.

2. The memory stack of claim 1, wherein the magnetic bias layer and the free layer are at the same side of the spin-orbit torque layer.

3. The memory stack of claim 2, further comprising a non-magnetic metal spacer between the magnetic bias layer and the free layer, wherein the non-magnetic metal spacer includes PtCo, WCoFeB, Ru, RuFe, RuCo, Ir, IrFe, IrCo or a combination thereof.

4. The memory stack of claim 1, wherein the magnetic bias layer and the free layer are at opposite sides of the spin-orbit torque layer.

5. The memory stack of claim 1, wherein a width of the magnetic bias layer is substantially equal to a width of the free layer.

6. The memory stack of claim 1, wherein a width of the magnetic bias layer is greater than a width of the free layer.

7. The memory stack of claim 1, wherein the free layer comprises FeCo, CoFeB, FeB or a combination thereof, and the magnetic bias layer comprises Co, CoNi or a combination thereof.

8. A memory stack, comprising:
a spin-orbit torque layer;
a synthetic free layer disposed over the spin-orbit torque layer and comprising:
a first free layer with a perpendicular magnetic anisotropy; and
a second free layer with a horizontal magnetic anisotropy;
a tunneling barrier layer disposed over the synthetic free layer; and
a reference layer disposed over the tunneling barrier layer.

9. The memory stack of claim 8, wherein the first free layer is in physical contact with the spin-orbit torque layer.

10. The memory stack of claim 8, wherein the synthetic free layer further comprises a non-magnetic metal spacer between the first free layer and the second free layer.

11. The memory stack of claim 8, wherein the second layer of the synthetic free layer is oriented in the (100) direction.

12. The memory stack of claim 8, further comprising a capping structure disposed over the reference layer, wherein the capping structure comprises Ta, Ru or a combination thereof.

13. The memory stack of claim 12, further comprising a synthetic antiferromagnetic layer disposed between the capping structure and the reference layer.

14. The memory stack of claim 13, wherein the synthetic antiferromagnetic layer is oriented in the (111) direction or the (100) direction.

15. The memory stack of claim 8, wherein the tunneling barrier layer is oriented in the (100) direction.

16. The memory stack of claim 8, wherein the reference layer is oriented in the (100) direction.

17. A memory device, comprising:
a substrate;
a first transistor disposed over the substrate and having a first source/drain region;
a second transistor disposed over the substrate and having a second source/drain region; and
a MRAM cell disposed over the substrate and comprising:
first and second bottom electrodes respectively coupled to the first source/drain region and the second source/drain region;
a spin-orbit torque layer disposed over the first and second bottom electrodes;
a synthetic free layer disposed over the spin-orbit torque layer and comprising two layers configured to have magnetic anisotropies perpendicular to each other;
a tunneling barrier layer disposed over the synthetic free layer;
a reference layer disposed over the tunneling barrier layer; and
a top electrode disposed over the reference layer and coupled to a bit line.

18. The memory device of claim 17, wherein the layer of the synthetic free layer that is in physical contact with the spin-orbit torque layer forms a perpendicular magnetic anisotropy with the spin-orbit torque layer.

19. The memory device of claim 17, further comprising a dummy transistor between first transistor and the second transistor, wherein the dummy transistor is grounded.

20. The memory device of claim 17, wherein the tunneling barrier layer, the reference layer and part of the synthetic free layer are all oriented in the (100) direction.

* * * * *